United States Patent [19]

Hareyama

[11] 4,393,370
[45] Jul. 12, 1983

[54] DIGITAL TO ANALOG CONVERTER USING MATRIX OF CURRENT SOURCES

[75] Inventor: Kyuichi Hareyama, Tokyo, Japan

[73] Assignee: Nippon Electric Co., Ltd., Tokyo, Japan

[21] Appl. No.: 258,711

[22] Filed: Apr. 29, 1981

[51] Int. Cl.³ .............................................. H03K 13/02
[52] U.S. Cl. ............................................ 340/347 DA
[58] Field of Search .................... 340/347 DA, 825.91

[56] References Cited

U.S. PATENT DOCUMENTS

| 3,217,147 | 11/1965 | Chapman | 340/347 DA |
| 3,609,661 | 9/1971 | Hennes | 340/825.91 |
| 3,823,386 | 7/1974 | Gilbert | 340/347 DA X |
| 4,024,352 | 5/1977 | Mukaemachi | 340/825.91 |

OTHER PUBLICATIONS

Schoeff "Digest of Technical Papers", 1979 IEEE International Solid-State Circuits Conf., Feb. 15, 1979, pp. 178-179, 292-293.

Danielsson "Digital Processes" 1979, pp. 133-140.

Primary Examiner—C. D. Miller
Attorney, Agent, or Firm—Sughrue, Mion, Zinn, Macpeak and Seas

[57] ABSTRACT

A semiconductor circuit having an improved current switching function is disclosed. The circuit comprises at least one current switch unit including a current source, a current output node, a field effect transistor connected between the current output node and the current source, an inverting amplifier having an output supplied to a gate of the field effect transistor and an input connected to the junction point of the current source and the field effect transistor and means for controlling operation of the amplifier.

13 Claims, 19 Drawing Figures

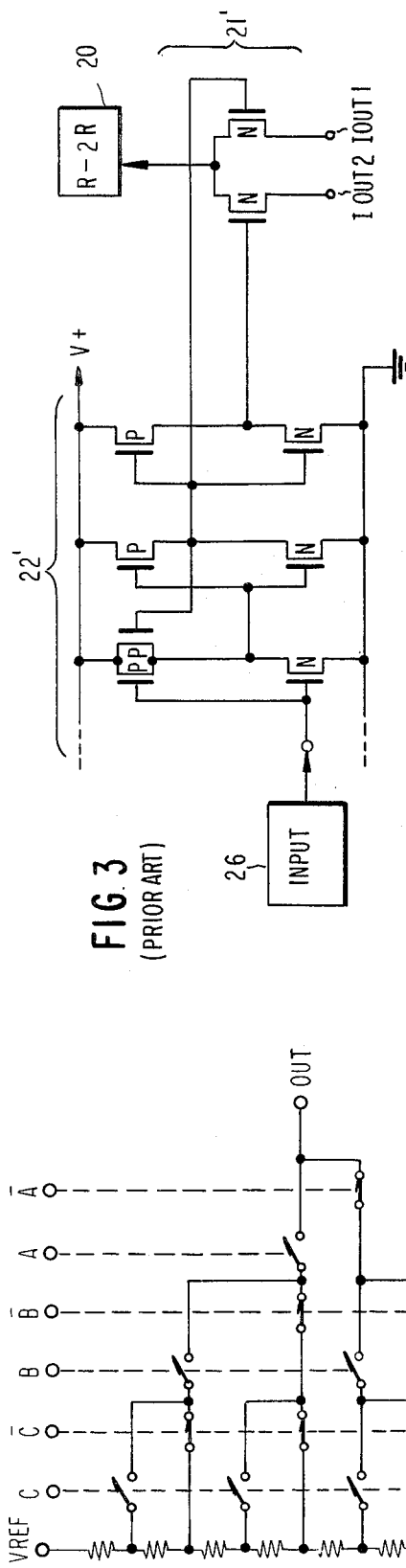
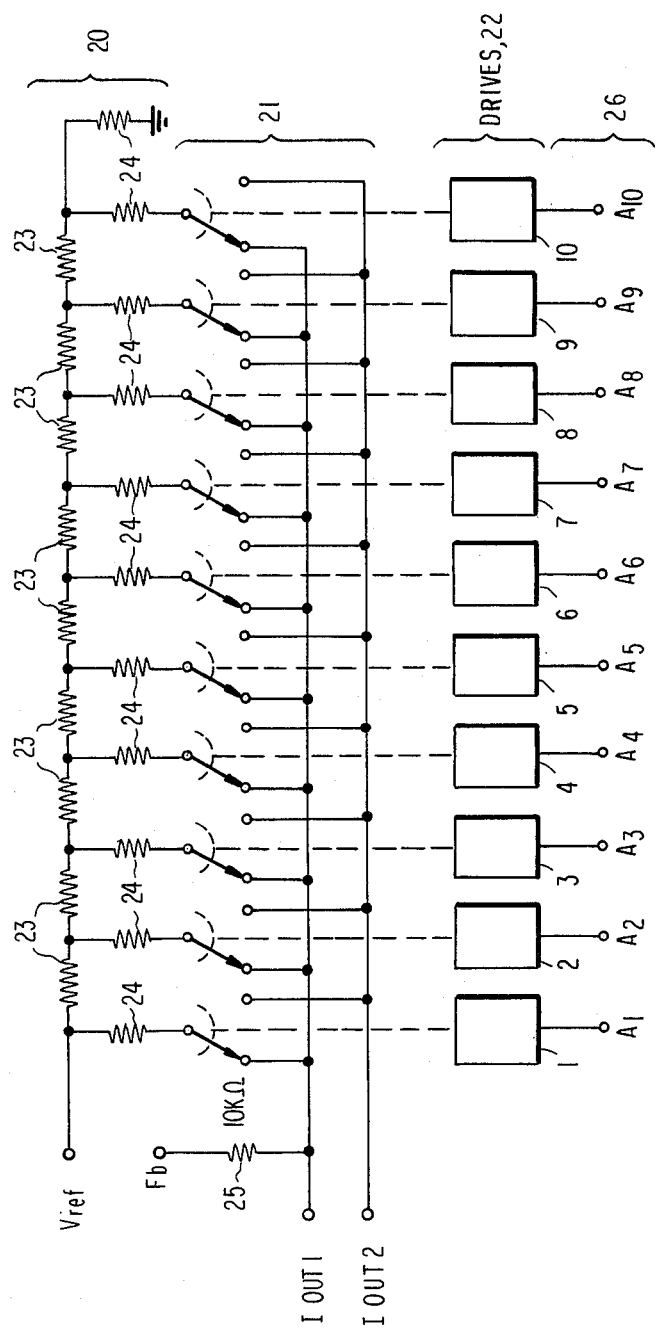
FIG. 1 (PRIOR ART)
FIG. 2 (PRIOR ART)
FIG. 3 (PRIOR ART)

DIGITAL TO ANALOG CONVERTER USING MATRIX OF CURRENT SOURCES

The present invention relates a semiconductor circuit, and more particularly to a semiconductor current switch circuit and a Digital-Analog Converter (hereinafter referred to as DAC) fabricated as an integrated circuit. DAC's are used for converting a digitally coded signal to an analog signal and the theory of operation for DAC's is described in the book "Analog Integrated Circuit Design", by A. B. Grebene, Van Nostrand, 1972, p. 328–350.

Recently, a DAC employing a single resistor string provided with a plurality of intermediate taps and a plurality of MOS transistors arranged between the respective intermediate taps and an output terminal was proposed in "International Solid-State Circuit Conference" held in 1976 in Philadelphia, U.S.A. by Adib R. Hamade (Digest of Technical Papers pp. 154 to 155).

This DAC has a simplified circuit structure and is suitable for fabrication in the form of a monolithic integrated circuit. This DAC also provides an essentially monotonic input-output characteristic. However, sine an output signal is derived from the resistor-division voltage at the intermediate tap through the MOS transistor, an output impedance is very large. Therefore, the output is difficult to use or utilize. Furthermore, a plurality of MOS transistors are connected between the intermediate tap and the output terminal and hence high operation speed cannot be obtained.

As another type of DAC, one employing an R-2R resistor ladder circuit has been utilized, which is disclosed, for example, in the U.S. Pat. No. 4,092,639. This type of DAC requires high accuracy in the resistor ladder circuit which is therefore usually fabricated with a trimmed thin resistive film. Therefore, it cannot be fabricated with ease. Furthermore, the stability in current output characteristic of current switch circuits employed in DAC's are not sufficient.

SUMMARY OF THE INVENTION

It is an object of the present invention to provide a semiconductor circuit operable at a high-speed.

It is another object of the present to provide a DAC suitable for being fabricated as a monolithic integrated circuit.

It is still another object of the present invention to provide a current switch circuit suitable for a monolithic type DAC.

It is still another object of the present invention to provide a DAC having a high output compliance characteristic.

A DAC according to the present invention comprises a plurality of current source switch cells, means for receiving digitally coded signals, means responsive to the content of the digitally coded signals for enabling a selected number of the current source switch cells and means for summing the output currents of the enabled current source switch cells, in which the summed amount of the output current corresponds to the digitally coded signal.

In the DAC according to the present invention, the current source switch cells are preferably arranged in a matrix form.

It should be noted that the term "DAC" implies an analog to digital converter for converting an analog signal to a digital signal as well as a digital to analog converter for converting a digital signal to analog signal throughout the description of the present invention.

A DAC according to the present invention has a very high output compliance characteristic, and maintains the necessary accuracy for an extremely large analog output amplitude.

Furthermore, the DAC of the present invention is operable by a single power voltage such as 5 V so that the DAC is capable of coexistence with ordinary logic circuits, and a circuit means well adapted for a monolithic integrated circuit. Further, the DAC has a virtually monotonic conversion characteristic, and is of the current output type so that the DAC is operable at a high speed.

According to one aspect of the present invention, there is provided a semiconductor circuit comprising an output terminal, means for receiving a plurality of binary signals, a plurality of switch cells in a matrix form of columns and rows, each of said cells having an output node and first to third nodes, a plurality of first control lines extended in a column direction, each of said control lines being connected to the first nodes of the cells in an associated column, a plurality of second control lines extended in a row direction, each of said second control lines being connected to the second nodes of the cells in an associated row, a plurality of third control lines extended in a row direction, each of the third control lines being connected to the third nodes of the cells in associated row, first means responsive to a part of said binary signals for energizing a first selected number of said first control lines, second means responsive to a part of said binary signals for energizing a second selected number of said second control lines, third means responsive to a part of said binary signal for selectively energizing at least one of said third control lines, said one of said third control lines belonging to a row different from the rows of said energized second control lines, and means for connecting said output nodes of said cells to said first output terminal.

According to another aspect of the present invention, there is provided a semiconductor circuit comprising a first output terminal, a second output terminal, means for receiving a plurality of digital signals, a plurality of current source switch cells adjacently arranged in a matrix array with rows and columns, each of said cells having first and second output nodes and first to third control nodes, a plurality of column lines extended in said columns, a plurality of first row lines extended in said rows, a plurality of second row lines extended in said rows, each of said column lines being connected to the first control nodes of the cells in the associated column, each of said first row lines being connected to the second control nodes of the cells in the associated rows, each of said second row lines being connected to the third control nodes of the cells in the associated rows, first means responsive to a part of said digital signals for supplying a selected number of said column lines with a selection level, second means responsive to a part of said digital signals for supplying a selected number of said first row lines with a selection level, third means responsive to a part of said digital signals for supplying one of said second row lines with a selection level, means for connecting said first output nodes to said first output terminal, and means for connecting said second output nodes to said second output terminal.

According to still another aspect of the present invention, there is provided a circuit comprising a current source, a field effect transistor (hereinafter referred to as FET), means for connecting a source of the FET to the current source, an inverting amplifier having an input terminal, a control terminal and an output terminal, means for connecting the output terminal of the amplifier to the gate of the FET, means for connecting the input terminal to the source of the FET, a current output terminal, and means for connecting the drain of the FET to the current output terminal.

According to still another aspect of the present invention, there is provided a monolithic digital-analog converter comprising current source switch cells adjacently arranged in a matrix array with M rows and N columns (M and N are positive integers of 2 or more), a first output terminal, a first group of control signal lines for selecting m number of rows (m is 0 or a positive integer defined by $0 \leq m \leq M$), second and third groups of control signal lines for selecting a given column and another n number of columns except said given column (n is 0 or a positive interger defined by $0 \leq n \leq N-1$) from said other columns than the given column, an L bit digital input means, a first encode circuit for controlling said first control signal line groups in accordance with the lower bits of said L bit digital input signals, and second and third encode circuits for controlling said second and third control signal line group in accordance with the upper bits of said L bit digital input, wherein said current source cell includes at least a current source, a current switch, and a control circuit for controlling said current switch in accordance with the input signals from said first to third signal line groups. The digital to analog converter operates in a manner that the output signals from all of the current source switch cells belonging to said given n number of columns are all led to said first output terminal irrespective of said first control signal. The current source switch cells belonging to said given one column are dependent on said first control signal, and the current source switch cells belonging to a the m number of rows and said given one column are led to said first output terminal. The current source switch cells belonging to other rows and said given one column are off, and the current source switch cells belonging to said given n number of columns and the other columns than said given one column all operate to turn off irrespective of said first control signal.

According to another aspect of the present invention, there is provided a monolithic digital to analog converter comprising current switch cells adjacently arranged in a matrix array with M rows and N columns (M and N are positive integers of 2 or more), first and second output terminals, a first group of control signal lines for selecting a specific m number of rows (m is 0 or a positive integer defined by $0 \leq m \leq M$), second and third groups of control signal lines for selecting a given column and another n number of columns except said given column (n is 0 or a positive integer defined by $0 \leq n \leq N-1$) from said other columns than the given column, an L bit digital input means, a first encode circuit for controlling said first control signal line group in accordance with the lower bits of said L bit digital input signal, and second and third encode circuits for controlling said second and third control signal line groups in accordance with the upper bits of said L bit digital input, wherein said current cell includes at least a current source, a current switch, and a control circuit for controlling said current switch in accordance with the input signals from said first to third signal line groups. The digital to analog converter operates in a manner that the output signals from all of the current source switch cells belonging to said given n number of columns are all led to said first output terminal irrespective of said first control signal, and the output signals from the current switch cells belonging to said given one column are dependent on said first control signal. The output signal from the current switch cells belonging to a given m number of rows belonging to said given one column are led to said first output terminal. The output signal from the current switch cells belonging to said given one column in other rows are led to said second output terminal, and the output signals from the current switch cells belonging to said given n number of columns and the columns other than said given one column are led to said second output terminal irrespective of said first control signal.

In this monolithic digital to analog converter, the converter may comprise a first FET serving as a current source for said current switch cell, a second FET operating as a current switch, a multi-input logic gate whose first input is connected to a common connection point of the source of said second FET and the drain of said first FET, a circuit connection of said logic gate output to the gate of said second FET, a circuit connection of the drain of the drain of said second FET to said first output terminal, and means for applying the signals from said first, second and third signal line groups, respectively, to the other input terminals of said multi-input logic gate.

In the monolithic digital to analog converter, the converter may comprise a first FET serving as a current source for said current source switch cell, second and third FET forming a differential current switch, a first two-input NOR logic gate which is connected at its first input to a common connecting point of the common source of said second and third FETs and the drain of said first MOS FET, a circuit connection of the output of said gate to said second MOS FET, a circuit connection of the drain of said second FET to said first output terminal, a second logic gate connected at its first input terminal to said common connection point, a circuit connection of the output of said second logic gate to the gate of said third FET, and means for applying the signals from said first, second and third signal line groups, respectively, to the other input terminals of said second logic gate.

BRIEF DESCRIPTION OF THE DRAWINGS

FIG. 1 is a circuit diagram of a conventional DAC.

FIG. 2 is a circuit diagram of another embodiment of the conventional DAC.

FIG. 3 is a circuit diagram of an example of the conventional DAC in FIG. 2.

DESCRIPTION OF THE PRIOR ART

Figure 4A:
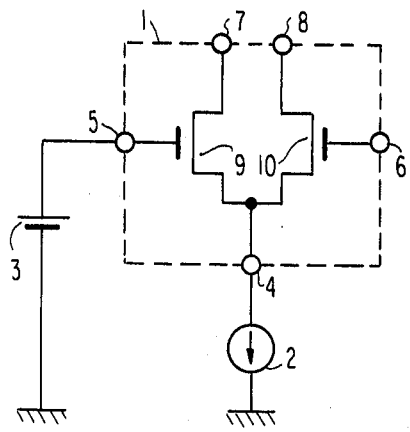
FIG. 4 is a diagram showing a conventional current switch circuit, where FIG. 4 (A) is a circuit diagram and FIG. 4 (B) is an equivalent modeling diagram.

FIG. 1 shows a conventional example of a DAC circuit means suitable for a MOS monolithic integrated circuit disclosed in Japanese laid-open patent application disclosure No. 28851/77, invented by Adib R. Hamade in the U.S.A. The details of the circuit means were also reported in the International Solid-State Circuit Conference held in 1976 in Philadelphia, U.S.A., in its issued "Digest of Technical Papers" (pp. 154 to 155). In FIG. 1 illustrating an example of a 3-bit digital input DAC, inputs A and $\overline{A}$ are true and complement digital inputs of the most significant bit (MSB); the inputs B and $\overline{B}$ the second bits; and inputs C and $\overline{C}$ true and complement inputs of the least significant bit (LSB). $2^3$ Resistors connected in series between a reference voltage terminal $V_{REF}$ and a ground terminal provide a plurality of tap potentials numbering $2^3 - 1$. The tap potentials corresponding to a digital input are led to an analog output terminal OUT by a decode circuit comprised of a plurality of switches such as MOS field effect transistor (MOS FET). The converter with such a construction has useful features. Namely, the circuit construction is simple and the circuit construction is suitable for the MOS monolithic integrated circuit. Also the converter may provide an essentially monotonic input-output characteristic.

However, since the converter circuit is of the voltage output type, it has a high output impedance. Therefore, the converter circuit is a circuit means suitable for an analog to digital converter circuit in which a comparator with a high input impedance compares a digitally synthesized analog output signal generated by the circuit of FIG. 1 with an unknown analog input signal. The application of the circuit means is also disclosed in the above-mentioned disclosure. When it is used as a digital to analog converter, however, a range of allowble load is extremely narrow and an output buffer amplifier is inevitably required. Further, in the N bit DAC, MOS switches are connected in series between a tap of a resistor string and an analog output terminal, so that a switching speed of the converter circuit means is reduced and therefore it is impossible to effect a high speed conversion.

As described above, the conventional converter has a circuit means suitable for fabrication an MOS integrated circuit, but it is not suitable for the general DAC for the reason that it can not have a substantial load and the converting time is long.

FIG. 2 shows a circuit diagram of another conventional DAC. The circuit construction was reported by James B. Cecil in International Solid-State Circuit Conference held on Feb. 15, 1974, in Philadelphia, Pa., U.S.A. and is described in the issued "Digest of Technical Papers" (pp. 196 to 197).

A so-called R−2R resistor ladder circuit is employed for a weighting resistor network 20 in the figure, in which a resistor 23 (R) in a first resistor group is 10 KΩ and a resistor 24 (2R) of second resistor group is 20 KΩ. A resistor 25 in a feedback impedance circuit in 10 KΩ. The complementary MOS (abgreviated as CMOS) FETs are used for current switches 21 and drive circuits 22. The output of each bit of a resistor network 20 is connected to two pairs of switches in the current switch 21 and is terminated to either of a first output $I_{OUT1}$ or a second output $I_{OUT2}$ in accordance with a digital input 26. The respective current switches 21 are driven by input circuits 1 to 10. Digital input signals $A_1$ to $A_{10}$ are applied to the respective input circuits, where $A_1$ is the most significant bit and $A_{10}$ is the least significant bit. Those bits $A_{10}$ to $A_1$ constitute binary weighted bits. The current switches 21 lead binary weighted currents to the output terminals.

FIG. 3 shows circuit portions 22' and 21' corresponding to one bit in the input circuits 22 and the current switch circuits 21 shown in FIG. 2. The current switch 21' is comprised of a pair of N channel FETs of the same conductivity type. The input circuit 22' applies voltage V+ to the gate of one FET being ON of the current switch 21', while ground potential is applied to the gate of the other FET. One end of the R-2R resistor ladder circuit 20 accordingly is terminated to either of the output terminal $I_{OUT1}$ or $I_{OUT2}$, through one of the FETs which is conductive.

The circuit means needs the R-2R resistor ladder having a high accuracy and the circuit must be constructed by the formation of a thin film resistor network on a silicon layer.

Therefore, there is drawback that a manufacturing cost of the circuit means is high. Further, the output terminal $I_{OUT1}$ must be an image ground potential terminal and therefore an operational amplifier is required in the application of the circuit means. The use of the operational amplifier needs positive and negative power sources. In order to obtain the positive output signal, a negative reference voltage is required. Also in this respect, the circuit means needs the positive and negative power sources. Therefore, the circuit means is inoperable with a single power voltage such as 5 V which is generally employed in the digital circuit. Consequently, application of the circuit means is limited.

Figure 4B:
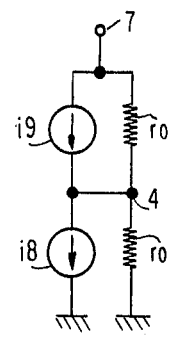

FIG. 4 (A) shows a conventional current switch circuit which has been utilized in DAC's. This circuit operates as a current switch for producing true and complement outputs at terminals 8 and 7 in response to an input applied to a terminal 6. In a closed state of this circuit where MOS transistor 9 is made conducting and a transistor 10 is made non-conducting in response to a low level at the terminal 6 and a current source 2 is assumed to be made of statically biased MOS transistor, an equivalent circuit of FIG. 4 (A) can be indicated by a modeling diagram of FIG. 4 (B) where a current source $I_9$ and a current source $I_8$ respectively correspond to the transistor 9 and the current source 2 of FIG. 4 (A) and $r_o$ is an output impedance. Here, it is assumed that a voltage at the terminal 4 is $V_4$ and a voltage at the terminal 7 is $V_7$, and an output current $I_7$ from the output terminal 7 becomes:

$$I_7 = (V_7 - V_4)/r_o - g_m \cdot V_4$$

$$= \frac{V_7/r_o + (1 + g_m \cdot r_o)g_m V_{G1}}{2 + g_m r_o}$$

where $g_m$ is a transconductance of the transistor and $V_{G1}$ is a gate voltage of the transistor forming the current source 2. The current source $i_9$ has a current value corresponding to $g_m \cdot (-V_4)$ while the current source $i_2$ has a current value corresponding to $g_m \cdot V_{G1}$. An output conductance of the circuit of FIG. 4(A) becomes:

$$\frac{\partial I_o}{\partial V_o} = \frac{1}{r_o(2 + g_m r_o)} \approx \frac{1}{(g_m r_o)r_o}.$$

In this circuit, a change in the output current due to an amplitude of the voltage $V_7$ is 0.006%/V. If the amplitude of the voltage $V_7$ is 10 V, then the change in the output current becomes 0.06% which value is not acceptable for a high-accuracy DAC.

DETAILED DESCRIPTION OF THE INVENTION

Next, with reference to FIGS. 5 and 6, a current switch circuit proposed by the present invention will be described.

Figure 5:
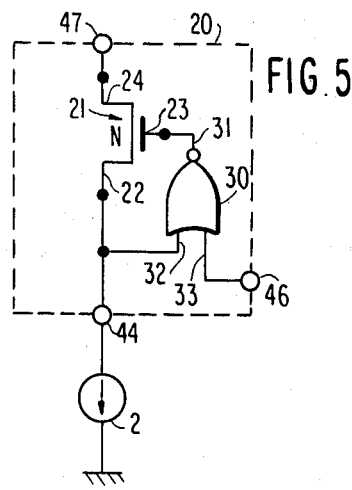
FIG. 5 is a circuit diagram showing a current switch circuit proposed by the present invention.

In FIG. 5, a current source 2 is connected to a terminal 44 of a switch circuit 20. The circuit 20 comprises an N-channel insulated gate field effect transistor 21, such as a MOS transistor, having a drain 24 connected to an output terminal 47 and a source 22 connected to the terminal 44, and a NOR gate having a first input 33 connected to a control terminal 46, a second input 32 connected to the terminal 44 and an output 31 connected to the gate 23 of the transistor 21. In this circuit, if the terminal 46 is held at a low level, the NOR gate 30 operates as an inverter circuit with the input 32 and the output 31 and hence the transistor 21 and the NOR gate 30 form a feed-back loop so that the transistor 21 is biased with the feed-back to become conductive. Thus, an output current is produced from the terminal 47.

On the other hand, if the terminal 46 is held at a high level, the output 31 of the NOR gate is low in level. Hence the feed-back loop is electrically cut off and the transistor 21 is non-conductive. Thus, the output current does not appear at the terminal 47.

Figure 6:
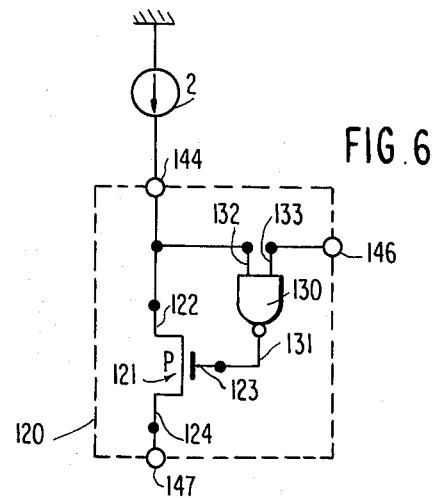
FIG. 6 is a circuit diagram showing another current switch circuit by the present invention.

FIG. 6 shows another current switch circuit proposed by the present invention.

In this circuit, a P-channel insulated gate field transistor 121 and a NAND gate 130 are employed. When the input to a control terminal 146 is at a high level, the NAND gate 130 operates as an inverter with an input 132 and an output 131, and the transistor 121 and the NAND gate 130 form a feed-back loop. Therefore, the transistor 121 is made conductive and an output current is generated at a terminal 147. On the other hand, if the input to the terminal 146 is at a low level, the output 131 of the NAND gate 130 is at a high level to make the transistor 121 non-conductive.

Figure 7:
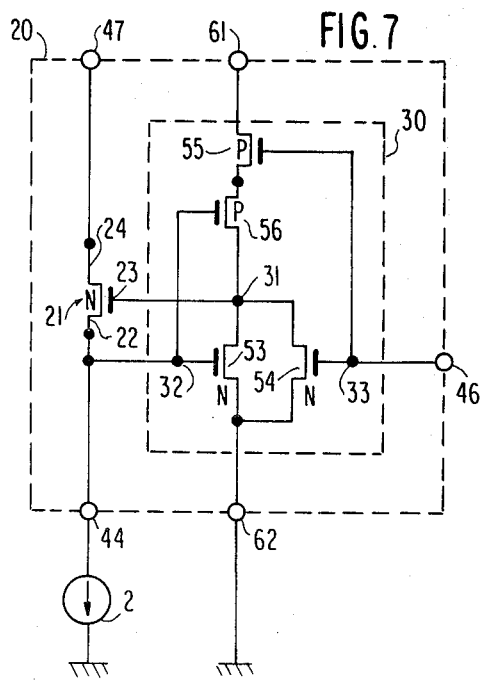
FIGS. 7 and 8 are circuit diagrams showing detailed circuit structure of FIG. 5.
Figure 8:
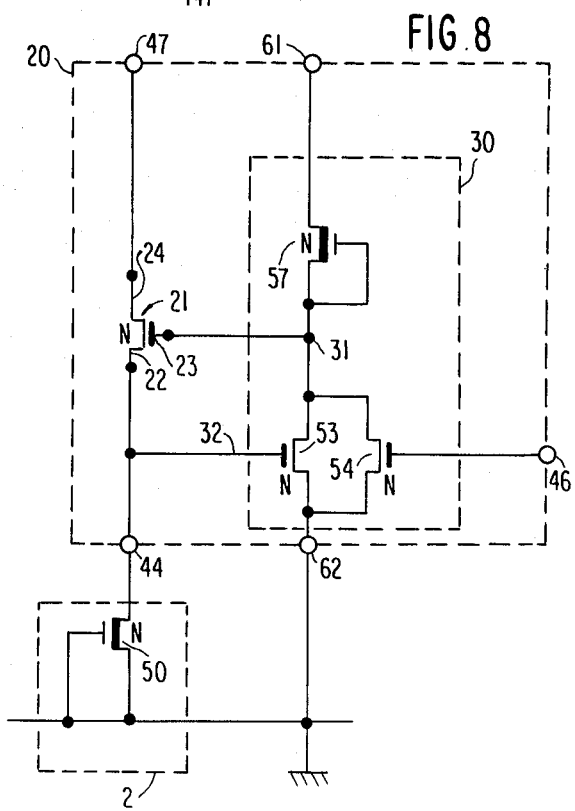

FIGS. 7 and 8 show different detailed circuit examples of the circuit shown in FIGS. 5 where the corresponding portions are denoted by the same reference numerals.

In FIG. 7, the transistors 55 and 56 are P-channel insulated gate field effect transistors, while the transistors 53, 54 and 21 are N-channel insulated gate field effect transistors.

In FIG. 8, an N-channel depletion type insulated gate field effect transistor 50 forms the current source 2. Transistors 21, 57, 53, and 54 are N-channel insulated gate field effect transistors and the transistor 57 is of a depletion type.

According to the above mentioned current switch circuits proposed by the present invention, stability in the output current can be remarkably improved.

For example, in the circuit of FIG. 5, the output current $I_o$ is represented by the following equation:

$$I_o = (V_o - V_1)/r_o + \mu \cdot g_m \cdot V_1$$

$$= \frac{V_o/r_o + (1 - \mu \cdot g_m \cdot r_o)g_m V_{G1}}{2 - \mu \cdot g_m \cdot r_o}$$

wherein $\mu$ denotes a gain factor of the NOR gate 30; $V_1$ the voltage at the terminal 44; $g_m$ the transconductance of the transistor 21; $V_o$ the voltage at the terminal 47; and $r_o$ an output resistance of the current source 2 and the transistor.

An output conductance in the ON state of the circuit is represented by the following equation:

$$\frac{\partial I_o}{\partial V_o} \approx \frac{1}{\mu \cdot (g_m r_o)r_o}$$

Thus, the output impedance is improved by $\mu$ times with respect to the conventional circuit. It is noted that the NOR gate should have a gain factor $\mu$ more than 1 and an inverter amplifier is preferable therefore.

According to the experiment conducted by use of the circuit of FIG. 8, the change in the output current at the terminal 47 due to the amplitude of $V_o$ was 0.000375%/V, which is improved by 16 times with respect to the conventional circuit.

Figure 9:
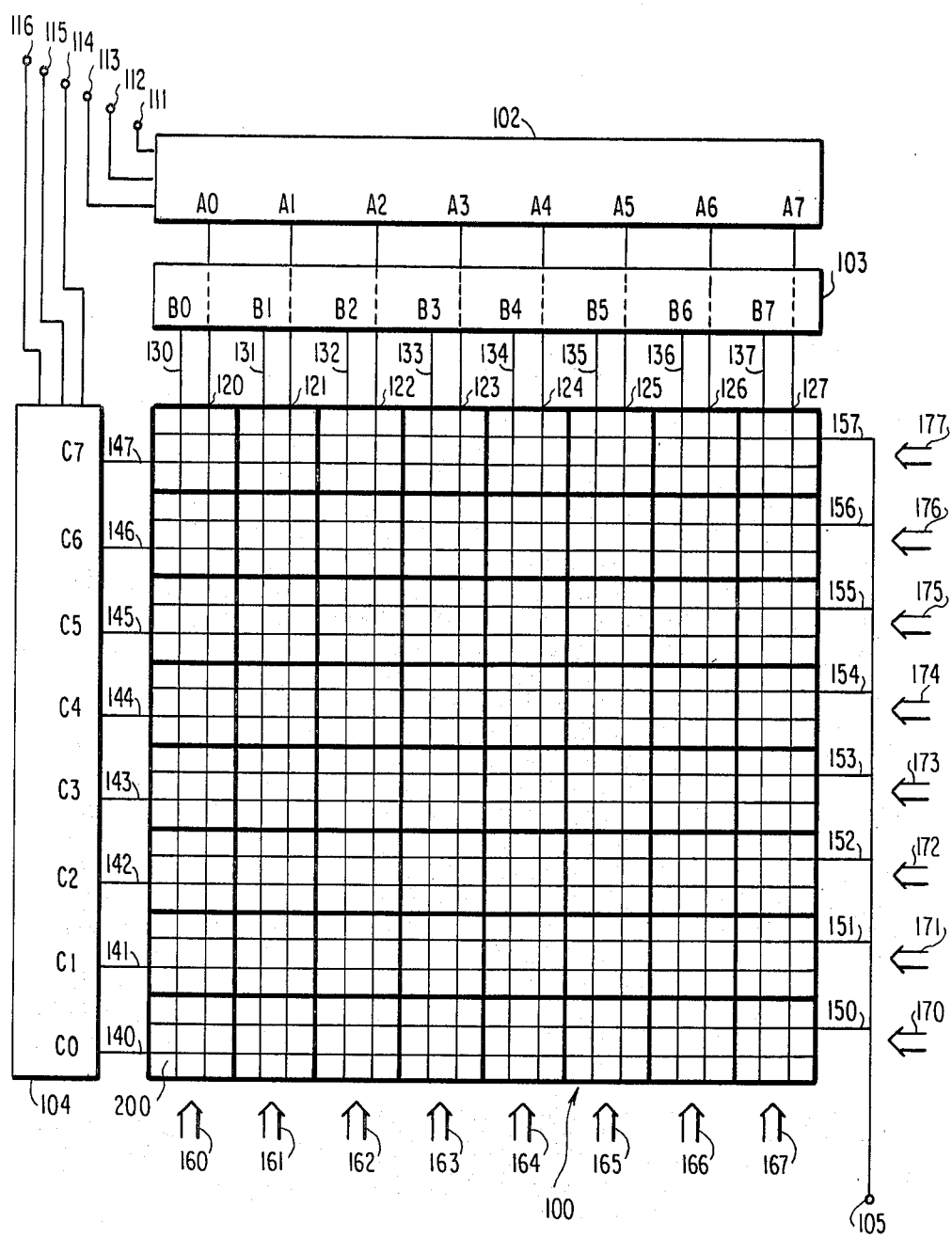
FIG. 9 is a schematic diagram of a DAC according to the present invention.

In FIG. 9 shows a basic construction of a DAC employing the current switch cells according to the present invention, and an example of a converter with 6-bit digital inputs is illustrated. A digital input terminal 111 for the most significant bit (MSB), and digital input terminals 112, 113, 114 and 115 for second to fifth bits, and a digital input terminal 116 for the least significant bit (LSB) are provided to receive the 6-bit input signals. Encoder circuits 102, 103 and 104 are each respectively comprised of a ROM (read only memory). Current switch cells 200 of the same configuration are arrayed in a matrix 100. The first encoder circuit 102 receives the upper three bit signals from the input terminals 111 to 113 and forms eight first encode signals $A_0$ to $A_7$ by using the upper three bits of the digital input signals which in turn are respectively applied to the current switch cells belonging to the same columns, through corresponding signal lines 120 to 127. The 0th to 7th columns are designated by numerals 160 to 167, respectively. Therefore, the signal line 120, for example, supplies the signal $A_0$ to all the current switch cells belonging to the 0th column 160.

The second encode circuit 103 further encodes the signals $A_0$ to $A_7$ of the first encode signal group to form second encode signals $B_0$ to $B_7$ which in turn are applied to the current switch cells belonging to the same column, through signal lines 130 to 137, respectively.

The third encode circuit 104 forms eight third encode signals $C_0$ to $C_7$ by using the lower seven bits of the digital input signal received from the input terminals 114 to 116, the 4th, 5th and the least significant bit (LSB). Those signals $C_0$ to $C_7$ are respectively supplied to the current switch cells belonging to the same rows, through corresponding signal lines. The 0th to 7th rows are denoted as 170 to 177, respectively. Accordingly, the signal line 143, for example, supplies the signal $C_3$ commonly to all the current switch cells belonging to the third row 173.

The output currents from the individual current switch cells may be derived from a terminal 105 through output lines designated by numerals 150 to 157. While FIG. 9 shows a construction of the single (true) analog output type, it is evident that the construction of the true and complementary current output type may be employed within the scope of the invention. From the foregoing description, the DAC of the present invention has, as basic constituent elements; first to third encode circuits, the first to third encode signal groups derived from the respective encode circuits, a group of the current source switch cells arranged adjacent to each other in a matrix fashion, and the current output means.

A principle of the operation of the DAC according to the present invention will now be described. Since the construction of FIG. 9 is that of a 6-bit DAC, a range of the input/output of the DAC may equally be divided, by the upper three bits, into eight segments. "000" of the upper three bits of the digital input code is assigned to the 0th segment. Similarly, "001" to "111" are assigned to the 1st to 7th segments, respectively. Eight codes from "000000" to "000111" belong to the 0th segment each, similarly. In this way, the subsequent segments have corresponding eight digital input codes. In the arrangement shown in FIG. 9, the current source switch cells of $2^6 = 64$ corresponding to 6 bits are an array of 8 in row by 8 in column as the current switch cell group 100. The current switch cells belonging to the columns 160 to 167 correspond to the 0th to 7th segments, respectively. The current switch cells of the rows 140 to 147 correspond to additionally weighted current sources whose ON or OFF condition is determined by the lower three bits. When the digital input signal is "011101", all the current source switch cells of the 1st to 3rd segments are ON since the upper three bits are "011", an additional five current switch cells in the 4th segment are ON, corresponding to the lower three bits of "101", and the remaining current switch cells in the 4th segment and all the current switch cells in the 5th, 6th and 7th are OFF. In this way, an analog output current corresponding to the code "011101" may be produced from the DAC.

Figure 10:
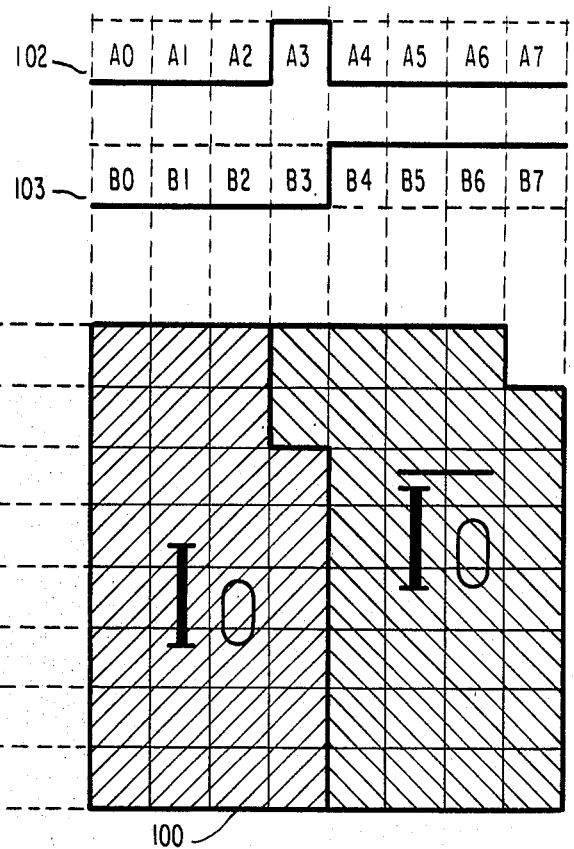
FIG. 10 is a schematic diagram of another embodiment of a DAC according to the present invention.

FIG. 10 shows a schematic diagram for explaining a construction of a DAC of the true and complementary current output type according to the present invention. Like reference numerals are used to designate like portions in FIG. 9. Explanation will proceed by using a case where the digital input signal applied to the DAC is "011110". Because of the "011" of the upper three bits, only $A_3$ in the output signals from the first encoder 102 has a high level, while all of the remaining output signals $A_0$ to $A_2$ and $A_4$ to $A_7$ have a low level. Correspondingly, $B_0$ to $B_3$ in the output signals from the second encoder 103 are low, while $B_4$ to $B_7$ are high.

For distinguishing the current sources led to a complementary output terminal $\bar{I}_o$ from those led to the terminal $I_o$, those groups of the current sources are shaded with different slant lines in the current switch array 100 arranged in the form of a matrix. The output signals from the current switches contained in the 4th to 7th columns to which $B_4$ to $B_7$ having a high level among the output signals from the second encoder 103 are applied, are all led to the terminal $\bar{I}_o$, not irrespective of on the output signals $C_0$ to $C_7$ of the third encoder 104. The current switch cells contained in the third column to which the low level output signal from the second encoder 103 and only one high level signal $A_3$ among those output signals from the first encoder 102 are applied, are dependent on the output signals $C_0$ to $C_7$ from the third encoder 104. The output signals from the current switch cells contained in the 0th to 5th lines to which the low level output signals $C_0$ to $C_5$ are applied, are led to the terminal $I_o$. The output signals from the current switch cells contained in the 6th and 7th rows to which the high level output signals $C_6$ to $C_7$ are applied, are led to the terminal $\bar{I}_o$. The output signals from the first and second encoders are all at a low level. The output signals from the current switch cells contained in the 0th to 2nd columns to which the output signals $A_0$ to $A_2$ and $B_0$ to $B_2$ are applied, are led to the terminal $I_o$, irrespective of the output signals from the third encoder 104. As shown, there is no current switch cell provided at a location of the 7th row and the 7th column. It is for this reason that, sometimes in the complementary output type DAC, zero output current of the output $I_o$ of "111111" is required and therefore this cell is omitted in this case.

Also in the arrangement of the DAC shown in FIG. 4, the current switch cell at the location of the 7th row and column is inactive and hence it is omissible.

Preferable input/output code characteristics of the encode circuits of the DAC according to the present invention, which operates as mentioned above, the tabulated in Tables 1 and 2.

TABLE 1

| | | Signal Line | Binary code data | | | | | | | |
|---|---|---|---|---|---|---|---|---|---|---|
| MSB | | 111 | 0 | 0 | 0 | 0 | 1 | 1 | 1 | 1 |
| 2nd bit | | 112 | 0 | 0 | 1 | 1 | 0 | 0 | 1 | 1 |
| 3rd bit | | 113 | 0 | 1 | 0 | 1 | 0 | 1 | 0 | 1 |
| 1st | A0 | 120 | 1 | 0 | 0 | 0 | 0 | 0 | 0 | 0 |
| encoder | A1 | 121 | 0 | 1 | 0 | 0 | 0 | 0 | 0 | 0 |
| output | A2 | 122 | 0 | 0 | 1 | 0 | 0 | 0 | 0 | 0 |
| | A3 | 123 | 0 | 0 | 0 | 1 | 0 | 0 | 0 | 0 |
| | A4 | 124 | 0 | 0 | 0 | 0 | 1 | 0 | 0 | 0 |
| | A5 | 125 | 0 | 0 | 0 | 0 | 0 | 1 | 0 | 0 |
| | A6 | 126 | 0 | 0 | 0 | 0 | 0 | 0 | 1 | 0 |
| | A7 | 127 | 0 | 0 | 0 | 0 | 0 | 0 | 0 | 1 |
| 2nd | B0 | 130 | 0 | 0 | 0 | 0 | 0 | 0 | 0 | 0 |
| encoder | B1 | 131 | 1 | 0 | 0 | 0 | 0 | 0 | 0 | 0 |
| output | B2 | 132 | 1 | 1 | 0 | 0 | 0 | 0 | 0 | 0 |
| | B3 | 133 | 1 | 1 | 1 | 0 | 0 | 0 | 0 | 0 |
| | B4 | 134 | 1 | 1 | 1 | 1 | 0 | 0 | 0 | 0 |
| | B5 | 135 | 1 | 1 | 1 | 1 | 1 | 0 | 0 | 0 |
| | B6 | 136 | 1 | 1 | 1 | 1 | 1 | 1 | 0 | 0 |
| | B7 | 137 | 1 | 1 | 1 | 1 | 1 | 1 | 1 | 0 |

TABLE 2

|  |  | Signal Line | Binary code data | | | | | | | |
|---|---|---|---|---|---|---|---|---|---|---|
| 4th bit |  | 114 | 0 | 0 | 0 | 0 | 1 | 1 | 1 | 1 |
| 5th bit |  | 115 | 0 | 0 | 1 | 1 | 0 | 0 | 1 | 1 |
| LSB |  | 116 | 0 | 1 | 0 | 1 | 0 | 1 | 0 | 1 |
| 3rd | C7 | 147 | 1 | 1 | 1 | 1 | 1 | 1 | 1 | 1 |
| encoder | C6 | 146 | 1 | 1 | 1 | 1 | 1 | 1 | 1 | 0 |
| (104) | C5 | 145 | 1 | 1 | 1 | 1 | 1 | 1 | 0 | 0 |
| output | C4 | 144 | 1 | 1 | 1 | 1 | 1 | 0 | 0 | 0 |
|  | C3 | 143 | 1 | 1 | 1 | 1 | 0 | 0 | 0 | 0 |
|  | C2 | 142 | 1 | 1 | 1 | 0 | 0 | 0 | 0 | 0 |
|  | C1 | 141 | 1 | 1 | 0 | 0 | 0 | 0 | 0 | 0 |
|  | C0 | 140 | 1 | 0 | 0 | 0 | 0 | 0 | 0 | 0 |

The second encoder 103 produces the encode signals $B_0$ to $B_7$ for selecting the segments to be led to the output terminal $\bar{I}_o$. As shown in Table 1, when the upper three-bit code is "011", the code $B_0$ to $B_7$ is "00001111". In this case, the signals $B_4$ to $B_7$ are "1", so that the output signals from the cells from the 4th to 7th segments are led to the output terminal $I_o$. The signals from $B_o$ to $B_3$ are "0".

The encode signal lines $A_0$ to $A_7$ produced from the first encoder supply signal "1" to the least segment of those segments whose outputs are not led to the $\bar{I}_o$, and so controls that the on-off of the current switch cells belonging to that segment depends on the lower three-bit digital input signal. The same encode signal line group supplies signals "0" to the remaining segments and so controls that the output signals from all the current switch cells belonging to the remaining segments always are led to the output terminal $\bar{I}_o$, irrespective of the three-bit digital input signal. For "011", for example, of the upper three-bit code, the code $A_0$ to $A_7$ is "00010000" and $A_3$ is 1 to select the 3rd segment, as seen from Table 2.

The output signals $C_0$ to $C_7$ of the 3rd encoder lead a given number of cells of the current switch cells belonging to the segment selected by the second encoder circuit to the terminal $I_o$, depending on the lower three-bit digital signal, while leading the remaining cells to the output terminal $\bar{I}_o$. As shown in Table 2, when the lower three-bit code is "110", for example, the code $C_0$ to $C_7$ is "00000011". Thus, the signals $C_6$ and $C_7$ are 1 and $C_0$ to $C_5$ are 0. Therefore, of the current source switch cells belonging to the segment (3rd column) selected by the upper three bits, the current source switch cells in the 6th and 7th have the output signals led to the terminal $I_o$ and the switch cells in the 0th to 5th rows have the output signals led to the terminal $\bar{I}_o$.

The DAC of the present invention operates in accordance with the principle of the operation, as mentioned above. Accordingly, the output currents of the current source switch cells are added to produce the output current, depending on the increase of the digital input code. Therefore, the present invention provides a circuit means well adaptable to fabrication for the monolithic DAC essentially having the monotonously increasing characteristic (monotonic input/output characteristic). In the circuit means of the present invention, only one current source switch cell is actuated in response to the changes of one of the LSBs of all the digital inputs and a spike noise (Glitch) at the time of the 1 LSB change is small. Therefore, the present invention provides a circuit means suitable for fabricating the monolithic DAC with a good Glitch characteristic.

An embodiment of a basic constitution element of the DAC according to the present invention will be described referring to the drawing.

Figure 11:
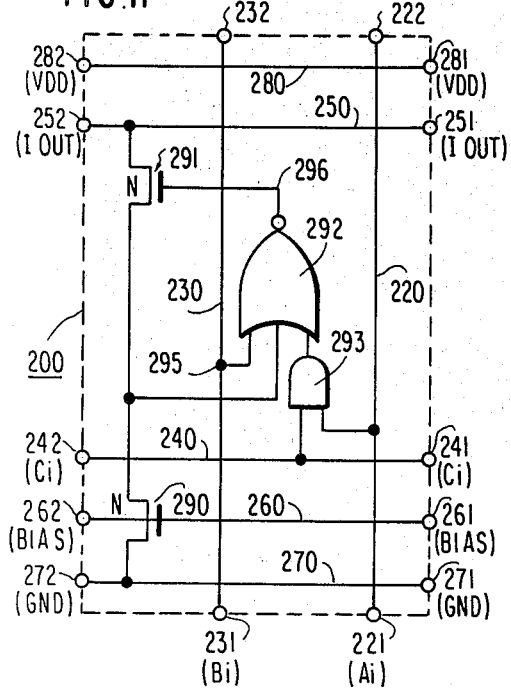
FIG. 11 is a circuit diagram showing an embodiment of a current switch cell as a constitutent element of a DAC of the present invention.

FIG. 11 shows a basic circuit construction 200 of one current switch cell which is formed by adding an address decode function to the NOR gate of FIG. 5. The current switch cell of the type in which it is turned on and off is preferably applicable for the switch cell array 100 shown in FIG. 9. Numeral 280 designates a power line connected to the adjacent current switch cells through the terminals 281 and 282. 270 designates a ground line connected through terminals 271 and 272 to exterior. 260 designates a line for applying a gate bias voltage of a current source FET 290 through terminals 261 and 262. Line 250 is an analog output line connected to the drain of a switch FET 291 and to exterior through terminals 251 and 252. 220 is an output line of the first encoder 102 having two terminals 221 and 222. Line 230 is an output signal line of the second encoder circuit 103 and connected to exterior through terminals 231 and 234, and line 240 is an output signal line of the third encoder circuit 104 and connected to exterior through terminals 241 and 242. As described above, all the lines are automatically connected to the other current switch cells arranged adjacently.

290 is the current source FET, as mentioned above, and all the FETs of the current switch cells are commonly biased. By fabricating all the current source FETs with the same configuration, each current switch cell turns on and off a unit current to provide a DAC with a linear input/output characteristic. A DAC with a non-linear characteristic for PCM may also be constructed in a manner that the current source FETs in each segment are formed with an idential configuration and the current source FETs in the 0th to 7th segments are binary-weighted.

Further, it is possible to employ optional weighting and to form a DAC with any non-linear characteristic. The drain of the current source FET 290 is connected to the source of the switch FET 291. The gate of the switch FET 291 is biased by a multi-input logic gate, that is, the output of an AND-NOR circuit designated by 292 and 293. With respect to the multi-input logic gate, various combinations are possible, depending on whether a positive and negative logic level is employed, and whether FET is P-channel or n-channel. The AND-NOR circuit is illustrated here as an example. The first input terminal of a two-input AND circuit 293 is connected to the output signal line 220 of the first encoder circuit. The second input terminal of the AND circuit 293 is connected to the output signal line 242 of the third encoder circuit. The output of a two-input AND 213 is connected to the first input terminal of a three-input NOR 292. The second input terminal of the three-input NOR 292 is connected to the output signal line 230 of the second encoder circuit. The third input terminal of the NOR 292 is connected to a common connection point of the drain of the current source FET and a source of the switch FET.

The operation of the current source switch cell will be described. When the output signal of the second encoder circuit 103 applied to the second input terminal of the NOR 292 through the line 230 is high in level, the output signal from the NOR 292 is low in level irrespective of the signal level at the remaining input terminals. As a result, the switch FET 291 is turned off. Accordingly, the output signal from the second encoder circuit serves as a inhibiting signal.

When the output signal from the second encoder circuit is low in level, the inhibiting condition of the cell is released, so that the output state of the cell is controlled by the output signals from the second and third encoder circuits. When the output signal from the first encoder circuit applied to the first input terminal of the AND gate 293 is low, the output signal from the AND 293 is low irrespective of the output signal of the third encoder circuit applied to the second input terminal of the AND 293. Accordingly, the first and second input terminals of the NOR circuit 292 are low, so that the NOR circuit 292 operates as an inverting amplifier having a third input connected to the terminal 295 and an output terinal 296. In this case, the FET 291 is feedback-biased to be ON, so that the present cell feeds current to the output line 250.

Under a condition that the output signal of the second encoder is low in level and the inhibiting state of the cell is released, when the signal level of the output signal from the first encoder circuit applied to the first input terminal of the AND 292 is inverted to a high level, the output state of the cell depends on the level of the output signal from the third encoder applied to the second input terminal of the AND 293. When the signal level at the second input terminal is high, the output signal from AND 293 is high and the output signal from the NOR 292 is low, so that the switch FET 291 is turned off and the cell is OFF (inhibited). On the other hand, when the signal level at the second input terminal of the AND 293 is inverted to low level, the NOR 292 operates as an inverting amplifier with an input of 295 and a output of 296, the switch FET 291 is feedback-biased to be ON, and this cell feeds current to the output line 250.

As described above, the current switch cell shown in FIG. 11 operates satisfactorily as the basic constituent element of the DAC of the present invention. In addition, the current switch cell remarkably improves the output impedance without making complicated the construction of the conventional analog current switch. Therefore, this switch cell is the preferable embodiment to realize the DAC with excellent output compliance as a monolithic integrated circuit. The output compliance characteristic of the DAC is a suppressing characteristic of the output current change with respect to the voltage amplitude at the analog current output terminal, and is a fundamental characteristic of the output current type DAC. The DAC with poor compliance characteristic can not satisfy a required accuracy over a wide range of the voltage amplitude at the output terminal.

In the current source switch cell shown in FIG. 11, when the first and second input terminals of the NOR gate 292 are previously low in level and the NOR 292 operates as the inverting amplifier, a closed feedback loop from the source of the switch FET 291 to the gate thereof is formed. Assuming that the FET 291 and the current source FET have the same configuration, the output current $I_5$ may be approximated as follows;

$$I_5 = (V_5 - V_{295})/r_o + \mu \cdot g_m \cdot V_{295}$$

$$= \frac{V_5/r_o + (1 - \mu \cdot g_m \cdot r_o) g_m V_G}{2 - \mu \cdot g_m \cdot r_o}$$

and the output conductance is expressed by $$\frac{\partial I_5}{\partial V_5} = \frac{1}{\mu \cdot (g_m \cdot r_o) r_o}$$

where the transconductance of the FETs is $g_m$, the output impedance $r_o$; the potential at the drain of the switch FET or the potential at the output terminal $V_5$; the potential at the common connection terminal 295 of the source of the switch FET 291 and the drain of the current source FET 290 $V_{295}$; the output current $I_5$; the gate bias voltage of the current source FET $V_G$; and $(-\mu)$ a gain of the NOR gate 292 operating as an inverting amplifier. The output impedance (reciprocal number of the output conductance) obtained by the conventional simple differential current switch is $(g_m r_o) \cdot r_o$. The switch cell shown in FIG. 11 attains an output impedance which is $\mu$ times that of a conventional one. It is well known to a person skilled in the art that the gain $\mu$ of NOR gate operating as the inverting amplifier is selected as 10 times or more. The experiment conducted by the inventors of the present invention showed that a fluctuation of the output currrent for the 10 V amplitude was 0.00375% and a rate of fluctuation was 0.000375%/V.

The value of the LSB in the 12-bit DAC is about 0.025% for the full-scale. Therefore, if an error corresponding to 1 LSB is allowed, 64 V of the voltage amplitude is allowed in the DAC using the current source switch cells according to the present invention. When simple differential analog current switches are used, the characteristic is deteriorated by $1/\mu$. The gain of the inverting amplifier used in the experiment was 16, so that when the conventional differential analog current switches are used, the amplitude allowance of the output voltage is considerably reduced to 4 V.

Figure 12:
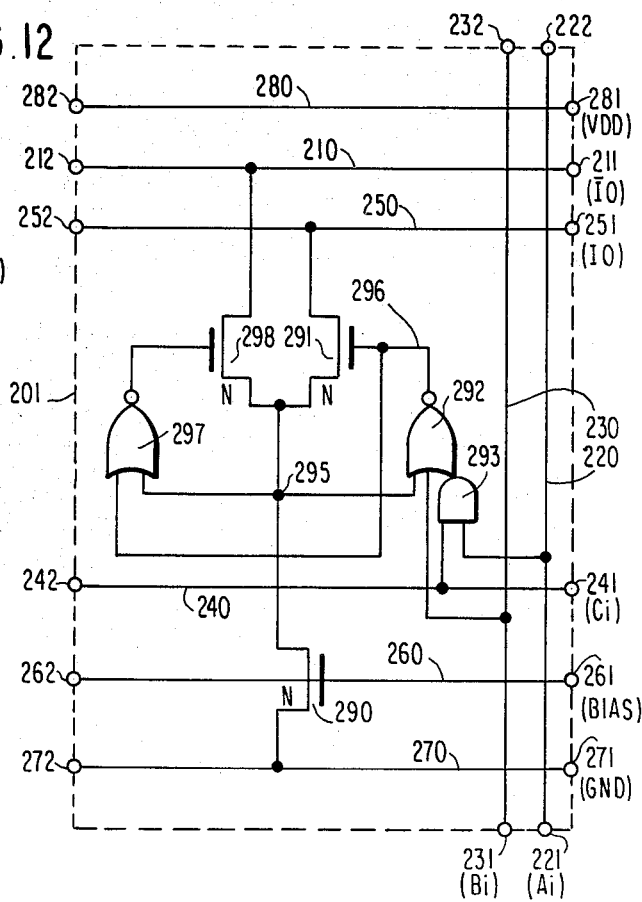
FIG. 12 is a circuit diagram showing another embodiment of the current switch cell as a constituent element of a DAC according to the present invention.

FIG. 12 is an embodiment of the complementary output type current switch cell which corresponds to the current source switch cell in FIG. 11 in addition to a complementary output terminal ($\overline{I_o}$), a differential switch MOS FET 298 and a control gate 297.

The present embodiment is a preferable embodiment of the current source switch cell well adapted for the complementary output type DAC as mentioned in FIG. 10. The same portions as in FIG. 11 are designate by the same reference numerals. When the output 296 from the gate 292 is low in level, the gate 287 serves as an inverting amplifier with an input of 295, an FET 298 is feedback-biased and the output signal from the cell under discussion is led to a terminal $\overline{I_o}$. When the gate 292 operates as an inverting amplifier and the FET 291 is feedback-biased, the terminal 296 has a high level signal for the input level of the gate 297 and the output of the gate 297 is low in level, so that an FET 298 becomes OFF. As described above, the switch cell effects the complementary output operation and essentially has a good characteristic, like the cell shown in FIG. 11.

Embodiments of the first and second encode circuits 102 and 103 will be described referring to FIG. 13. Each encode circuit may be realized by a ROM circuit. In the ROM circuit, solid lines are input/output signal lines, small circles at the cross points of the solid lines designate switch FETs and numerals 1102 and 1103 designate load circuits. The switch FETs properly arranged provide corresponding encode output signals. The circuit expression of the ROM circuit as shown is well known to persons skilled in the art to which the present invention pertains and hence no further detailed description about this will be given here. Upon receipt of a digital input signal of the upper three bits "101", at least one switch FET of those on the output signal lines 120 to 124 and 126 and 127 of the first encoder 102 is turned on and therefore the outputs $A_0$ to $A_4$ and $A_6$ and $A_7$ are low in level and none of the switches on the output line 125 are turned on. As a result, only the output $A_5$ is high in level.

Figure 13:
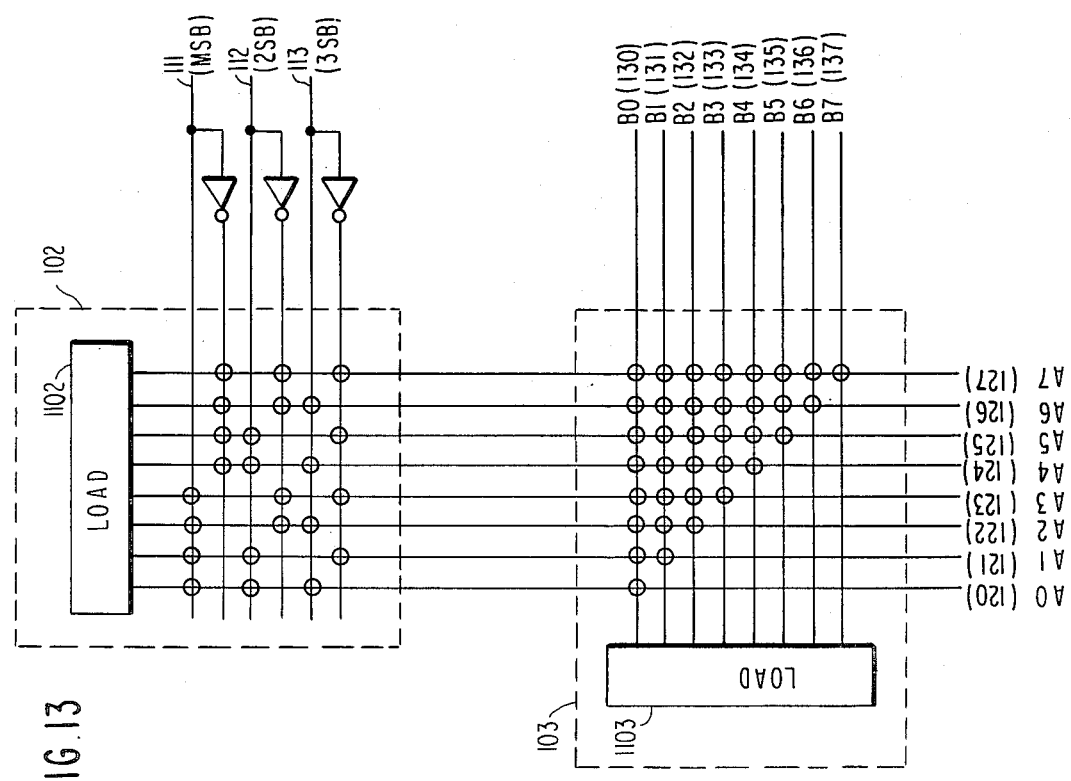
FIG. 13 is a schematic circuit diagram showing an embodiment of the first and second encoders of a DAC of the present invention.

An embodiment of the second encode circuit 103 with inputs of the output lines 120 to 127 of the first encode circuit 102 is also shown in FIG. 13. As in the above case, for the digital input signal of the upper three bits "101", only the signal $A_5$ on the signal line 125 is high in level, so that the switch FET on the output signal lines 130 to 135 of the second encode circuit are turned on. The result is that the output signals $B_0$ to $B_5$ are all low and none of the switch FETs on the output lines 136 and 137 are turned on. Therefore, the output signals $B_6$ and $B_7$ are high. The embodiments of the first and second encode circuits as mentioned briefly satisfy the input/output relations shown in Table 1.

Figure 14:
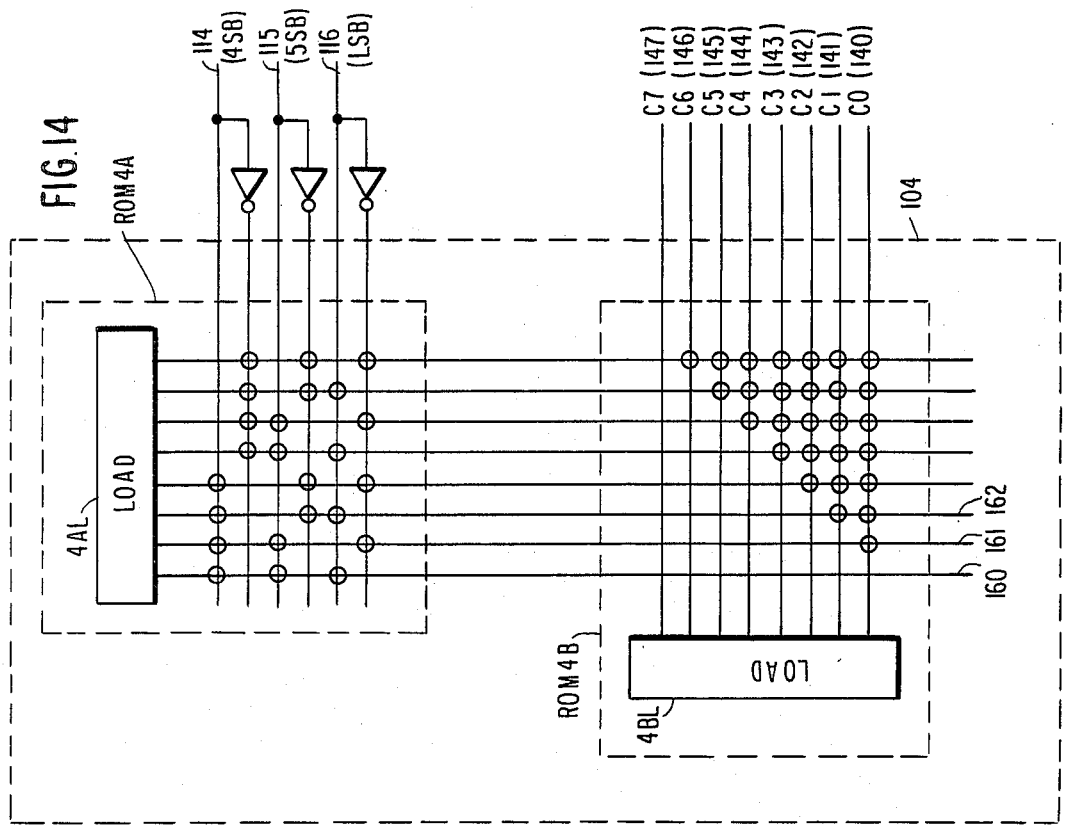
FIG. 14 is a schematic circuit diagram showing an embodiment of the third encoder of a DAC of the present invention.

FIG. 14 is an embodiment of the third encode circuit 104 for encoding the lower digital input signal and is comprised of a ROM circuit, a ROM4A and a ROM4B. With respect to the lower three bits digital input signal "010", only the output line 162 of the ROM4A has a high level signal. Therefore, in the ROM4B, only the data $C_0$ and $C_1$ on the output lines 140 and 141 have low level signals. The encode circuit including the ROM4A and ROM4B constitutes a preferred embodiment of the third encode circuit and satisfies the input/output code relations shown in Table 2. Incidentally, 4BL and 4AL are load circuits of the ROM4B and ROM4A, respectively.

Figure 15:
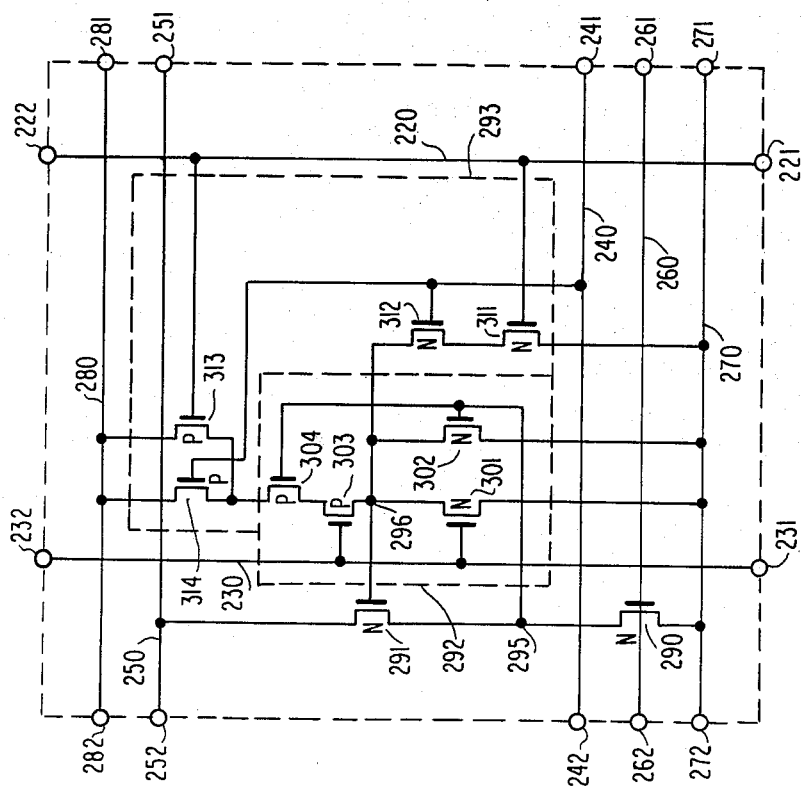
FIG. 15 is a circuit diagram of an embodiment of the current switch ell fabricated by a CMOS integrated circuit.

FIG. 15 is an example when the current switch cell shown in FIG. 11 is realized by an integrated circuit of the CMOS structure. Like reference numerals are applied to the denotation of like portions in FIG. 11. FETs 303 and 304 are P-channel MOSFETs and constitute a NOR circuit 292. FETs 314 and 313 are P-channel MOSFETs and FETs 311 and 312 are n-channel MOSFETs, and those constitute the AND gate 293. The AND gate 293, in cooperation with the gate 292, forms a multi-input logic gate. The current source switch cell of the CMOS type consumes no power in the control circuit in a stationary state and hence is a preferable embodiment for a low power consumption type DAC.

Figure 16:
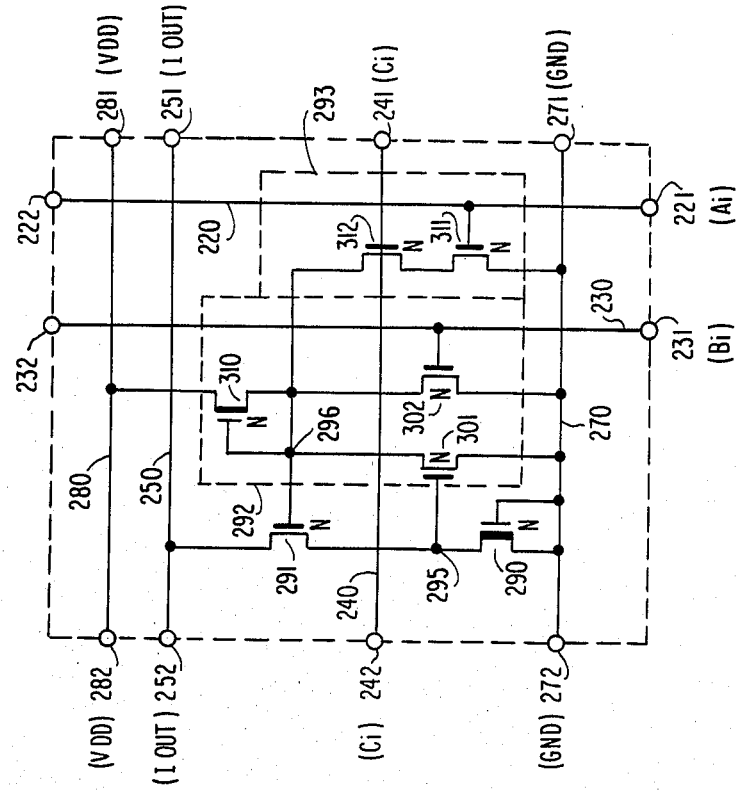
FIG. 16 is a circuit diagram showing an embodiment of a current source switch cell fabricated by E/D NMOS integrated circuit.

FIG. 16 shows an example when the current switch cell shown in FIG. 11 is realized by enhancement and depletion n-channel MOS (E/D NMOS) integrated circuit. The same portion as those in FIG. 11 are designated by the same numbers. In the present example, a depletion FET is used for the current source FET 290. In this case, no wiring for gate bias of the current source FET is needed but the absolute value of the output current greatly fluctuates due to the variation of threshold voltage and temperature variation. Accordingly, the circuit is unsuitable for the high accuracy DAC but is useful for a special application for a low quality audio output or the like. In FIG. 16, FETs 301, 302, 311 and 312 are the enchanment type n-channel FETs. The FETs 301 and 302 constitute the NOR gate (292) portion and the FETs 311 and 312 form the AND gate (293) portion. FET 310 is a depletion type n-channel FET which is commonly circuit-connected as a load to save the number of the cell elements. The current switch cell of the E/D NMOS structure suffers from the increase of power consumption in the control section but it needs a lesser number of elements. Accordingly, it is an economical circuit means when it is realized by using the integrated circuit, since the area occupied by the cell is small.

Figure 17:
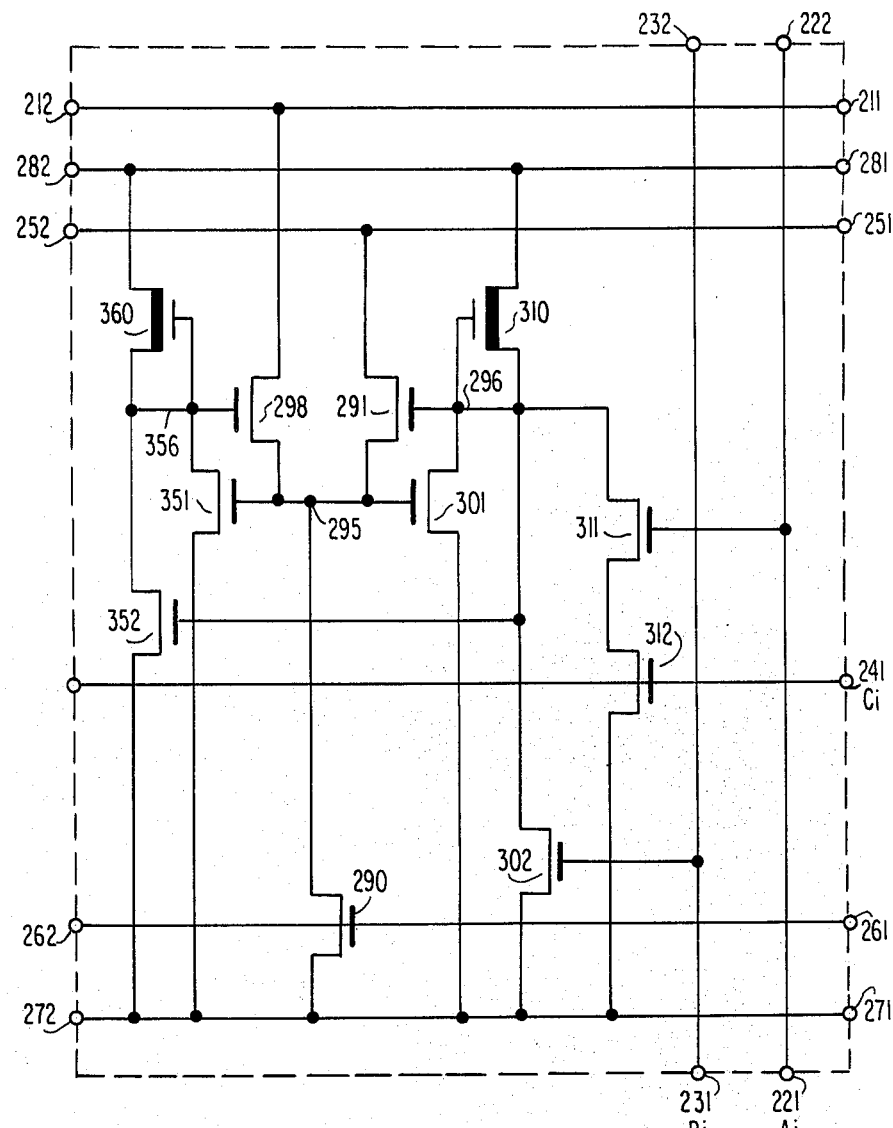
FIG. 17 is a circuit diagram showing another embodiment of the current switch cell manufactured by E/D NMOS integrated circuit.

FIG. 17 is a circuit means to realize the complementary output type current source switch cell shown in FIG. 12 by using E/D NMOS. Like numerals are applied to like portions in FIG. 12 or 16. A depletion type load MOS 360 and enhancement type drive MOS FETs 351 and 352 cooperate to form the NOR gate 297 in FIG. 12. This is added together with a switch FET 298 to the embodiment of FIG. 16. The present example uses an ordinary enhancement type FET for the current source FET 290. The bias voltage to the FET is supplied from an external bias circuit, through the bias line 260, the bias connection terminals 261 and 262, and adjacent cells.

Figure 18:
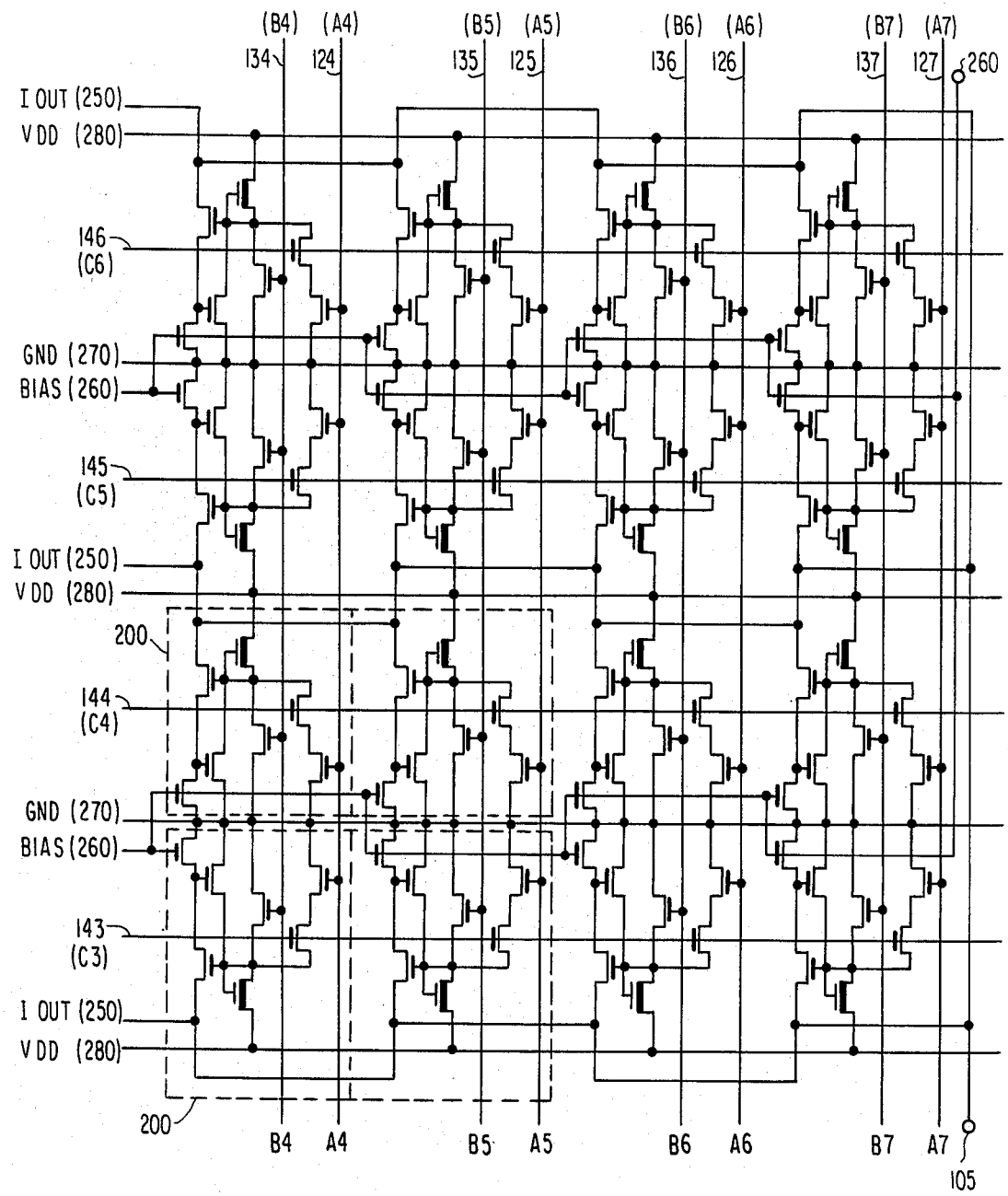
FIG. 18 is an equivalent circuit showing a part of a matrix array of the current source switch cells of a DAC of the present invention.

FIG. 18 shows an example of a part of the current source switch cell 200 arranged in a matrix in the DAC construction shown in FIG. 9. The same numerals are used for designating the same portion as those in FIG. 9 or 11. The E/D NMOS current source switch shown in FIG. 16 is employed for the cell as fundamental element. In order to attain a high accuracy, the enhancement type N-channel FETs with an external bias voltage supplied are used for the current source FETs. For economical cell layout, common wiring means is employed for the connection between the cells in FIG. 18. As illustrated, an output read wire (250), a bias voltage supply wire (260), a ground wire (270) and a $V_{DD}$ power source wire (280) may be commonly used between the cells, resulting in the reduction of the chip area.

Figure 19:
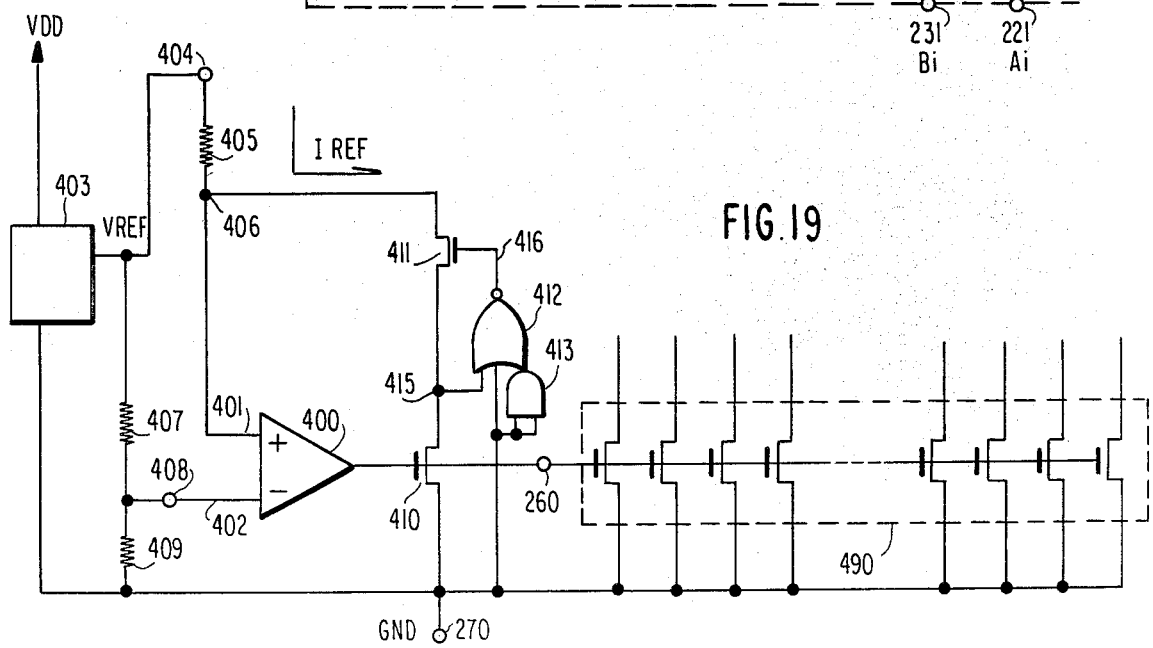
FIG. 19 is a circuit diagram showing an embodiment of an external bias means of a DAC of the present invention.

FIG. 19 shows an embodiment of an external bias means for the current source FETs shown in FIG. 17 or 18. Numeral 403 is a reference voltage source circuit connected between the power source $V_{DD}$ and ground and may be integrated in the same chip as the DAC or may be formed separately as an external circuit. 400 designates an operational amplifier which is combined with a resistor 405 and a reference current source FET 410 to form a voltage-current converter. Resistors 407 and 409 are voltage dividing resistors for providing a stable bias potential to the terminal 408. The combination of the FET 411 and the gates 413 and 412 forms an additional circuit which biases the reference current source FET 410 in the same condition as the bias of the current source FET group 490 in the cell. In the output state of each cell, the current source FETs of each cell and the reference current source FET are so biased that the gate-source voltage and the drain-source voltage are equal. Accordingly, the reference current $I_{Ref}$ and the DAC output current are subject to tracking with respect to the fluctuation in the input threshold voltage of the NOR gate 292 due to temperature and power source variation, so that a highly stable DAC can be realized.

As described above, the DAC of the present invention provides a DAC circuit means well adapted for the fabrication of MOSFET integrated circuit and particularly of very large scale integrated circuit which will be realized with further developments of the LSI for memory circuit. A high accuracy DAC with a multi-bit digital input may be realized by increasing the number of the matrix-arranged cells and the number of bits of ROM in the input encode circuits.

The present invention provides circuit means with high output compliance characteristic so that a high accuracy DAC can be realized by VLSI technology. The present invention can provide a circuit construction with a low power consumption and economical chip layout, as shown in the embodiment of CMOS structure of E/D NMOS structure.

The present invention provides a circuit means of the current output type, operable at a high speed, with a good Glitch characteristic at the time of switching and with a virtually monotonic characteristic. In the circuit means, the control circuit is arranged by the conventional logic circuit and the entire circuit including the switch circuit portion is operable by the single 5 V power drive. The circuit means of the DAC circuit including the power supply means is compatible with ordinary digital circuits such as a microcomputer.

Consequently, the monolithic digital to analog converter according to the present invention provides a novel DAC arrangement means and greatly contributes to the development of the technical field of the present invention.

I claim:

1. A semiconductor circuit comprising an output terminal; a plurality of current switch cells arrayed in a plurality of rows and columns, each of said cells including a current terminal, a current source and switch means coupled between the current terminal and current source and generating a current at the current terminal when selected; means for connecting the current terminals of said cells to said output terminal in common; means for receiving a plurality of digital signals; first means responsive to a first part of said digital signals for selecting a number of rows in accordance with said first part of said digital, and second means responsive to a second part of said digital signals for selecting the columns, whereby a number of cells corresponding to the value of said digital signals are simultaneously selected and currents from the selected cells are derived at said output terminal.

2. The circuit according to claim 1, in which said current source includes a field effect transistor having a gate biased with a predetermined potential.

3. The circuit according to claim 1, in which each of said cells further includes logic means for controlling the switch means in according with the associated outputs of said first and second means.

4. A semiconductor circuit comprising:
a first output terminal;
a second output terminal;
means for receiving a plurality of digital signals;
a plurality of switch cells adjacently arranged in a matrix array with rows and columns, each of said cells having first and second output nodes and first, second and third control nodes, a current source, a first field effect transistor connected between said first output node and said current source, a second field effect transistor connected between said second output node and said current source, a first NOR gate having an output end connected to a gate of said first transistor, a first input end connected to said current source, a second input end connected to said third control node, and a third input end, an AND gate having an output end connected to said third input end, a first input end connected to said first control node, and a second input end connected to said second control node, and a second NOR gate having an output end connected to a gate of said second transistor, a first input end connected to said current source and a second input end connected to the output end of said first NOR gate;
a plurality of column lines extended in said columns, each of said column lines being connected to the first control nodes of the cells in the associated column;
a plurality of first row lines extended in said rows, each of said first row lines being connected to the second control node of the cells in the associated rows;
a plurality of second row lines extended in said rows, each of said second row lines being connected to the third control nodes of the cells in the associated rows;
first means responsive to a part of said digital signals for supplying a selected number of said column lines with a selection level;
second means responsive to a part of said digital signals for supplying a selected number of said first row lines with a selection level;
third means responsive to a part of said digital signals for supplying at least one of said second row lines with a selection level;
means for connecting said first output nodes to said first output terminals; and
means for connecting said second output nodes to said second output terminals.

5. A semiconductor circuit comprising an output terminal, means for receiving a plurality of binarily weighted digital signals, a plurality of current switch cells in a matrix form of rows and columns, each of said cells having an output node coupled to said output terminal and first to third control terminals and generating a predetermined amount of current at its output node in accordance with signal levels at its first to third control terminals, a first control line for each row and connected to the first control terminals of the cells in the associated row, a second control line for each row and connected to the second control terminals of the cells in the associated row, a third control line for each column and connected to the third control terminals of the cells in the associated column, a first row decoder responsive to the upper significant bits of said digital signals for determining a number of said first control ines to be held at a selection signal level, means for selecting first control lines by the number determined by said first row decoder to hold the selected first conrol lines at the selection signal level, a second row decoder responsive to said upper significant bits of said digital signals for selecting one of the second control lines connected to the cell to which said selected first control lines are connected, means for supplying the selected one second control line with a selection signal, a column decoder responsive to the lower significant bits of said digital signals for determining a number of said third control lines to be held at a selection level, and means for selecting third control lines by the number determined by said column decoder to supply the selected third control line with a selection signal, whereby currents derived from the selected cells of the number corresponding to the digital value of said digital signals are summed and derived from said output terminal.

6. A semiconductor circuit comprising an output terminal, means for receiving a plurality of weighted digital signals, a plurality of current switch cells arrayed in a matrix form of rows and columns, each of said current switch cells having a current source, switch means coupled between said current source and said output terminal for, when enabled, supplying said output terminal with a current from said current source, first to third terminals, first logic means for generating a logic product of the signals at said second and third terminals, second logic means for generating a logic sum of a level at said first terminal and an output of said first logic means and means responsive to an output of said second logic means for operatively enabling said switch means, a first row line for each row and connected to the first terminals of the cells in the same row, a second row line for each row and connected to the second terminals of the cells in the same row, a column line for each column and connected to the third terminals of the cells in the same column, a first row decoder coupled to the first row lines for selecting a number of the first row lines corresponding to the contents of the upper significant bits of said digital signals, a second row decoder coupled to the second row lines for selecting one of said second row lines in accordance with the upper significant bits of said digital signals, and a column decoder coupled to the column lines for selecting a number of column lines corresponding to the lower significant bits of said digital signals.

7. The circuit according to claim 6, in which each of said cells includes first logic means for obtaining a logic product with respect to the signal levels on the second and third control lines and second logic means for obtaining a logic sum with respect to a logic output of said first logic means and a signal level of the first control line.

8. The circuit according to claim 7, in which said first logic means includes an AND circuit.

9. The circuit according to claim 7, in which said second logic means includes a NOR circuit.

10. The circuit according to claim 7, in which said first and second row decoders and said column decoder comprise read-only memories.

11. A semiconductor circuit comprising first and second output terminals, means for receiving a plurality of weighted digital signals, a plurality of current switch cells arranged in a matrix form of rows and columns, each of said cells including a current source, first switch means coupled between said first output terminal and said current source, second switch means coupled between said second output terminal and said current source, first to third control terminals, first logic means for generating a logic product of signals at said second and third control terminals, second logic means for generating a logic sum of a signal at said first control terminal and an output signal of said first logic means, means responsive to a first logic level of an output of said second logic means for operatively enabling said first switch means, and means responsive to a second opposite logic level of the output signal of said second logic means for operatively enabling said second switch means, a plurality of first row lines extending in a row direction, each of said row lines being connected to the first control terminals of the cells in the associated row, a plurality of second row lines extending in the row direction, each of said second row lines being connected to the second control terminals of the cells in the associated row, a plurality of column lines extending in a column direction, each of said column lines being connected to the third control terminals of the cells in the associated column, a first row decoder responsive to the upper significant bits of said digital signals for selecting a number of first row lines corresponding to the contents of said upper significant bits, a second row decoder responsive to the upper significant bits of said digital signals for selecting one of said second row lines, and a column decoder responsive to the lower significant bits of said digital signals for selecting a number of said column lines corresponding to the contents of said lower significant bits.

12. The circuit according to claim 11, in which said first logic means includes an AND circuit and said second logic means includes a NOR circuit.

13. A semiconductor circuit comprising:
an output terminal;
means for receiving a plurality of binary signals;
a plurality of switch cells in a matrix form of columns and rows, each of said cells having an output node and first, second and third nodes, a current source, a field effect transistor connected between said output node and said current source, a NOR gate having a first input end connected to the junction of said transistor and said current source, a second input end connected to said second node, a third input end and an output end connected to a gate of said transistor, and an AND gate having an output end connected to a gate of said third input end, a first input end connected to said first node and a second input end connected to said second input end;
a plurality of first control lines extended in a column direction, each of said control lines being connected to the first nodes of the cells in an associated column;
a plurality of second control lines extended in a row direction, each of said second control lines being connected to the second nodes of the cells in an associated row;
a plurality of third control lines, each of third control lines being connected to the third nodes of of the cells in an associated row;
first means responsive to a part of said binary signals for energizing a first selected number of said first control lines;
second means responsive to a part of said binary signals for energizing a second selected number of said second control lines;
third means responsive to a part of said binary signal for selectively energizing at least one of said third control lines, said one of said third control lines belonging to a row different from the rows of said energized second control lines; and
means for connecting said output nodes of said cells to said first output terminal.

* * * * *

UNITED STATES PATENT AND TRADEMARK OFFICE
CERTIFICATE OF CORRECTION

PATENT NO. : 4,393,370
DATED : July 12, 1983
INVENTOR(S) : Kyuichi Hareyama

It is certified that error appears in the above-identified patent and that said Letters Patent is hereby corrected as shown below:

THE TITLE PAGE:

Please insert --[30]   Foreign Application Priority Data
April 30, 1980 [JP] Japan ........55-57395--

Column 1, line 25, "sine" should be --since--

Column 1, line 45, after "present" insert --invention--

Column 3, line 26, "group" should be --groups--

Column 5, line 14, "ell" should be --cell--

Column 6, line 20, "abgreviated" should be --abbreviated--

Column 8, line 4, "Figs" should be --Fig--

Column 10, line 38, "$I_o$" should be --$\bar{I}_o$--

Column 11, line 22, "$I_o$" should be --$\bar{I}_o$--

Column 12, line 18, "circuit" should be inserted after "encoder"

Column 12, line 35, "idential" should be --identical--

Column 13, line 14, "terinal" should be --terminal--

Column 13, line 23, "292" should be --293--

Column 14, line 45, "designate" should be --designated--

Column 15, line 62, "enchantment" should be --enhancement--

UNITED STATES PATENT AND TRADEMARK OFFICE
CERTIFICATE OF CORRECTION

PATENT NO. : 4,393,370

DATED : July 12, 1983

INVENTOR(S) : Kyuichi Hareyama

It is certified that error appears in the above-identified patent and that said Letters Patent is hereby corrected as shown below:

<u>CLAIMS</u>

Column 18, line 45, "ines" should be --lines--

Column 20, line 45, delete "of" (first occurrence)

Signed and Sealed this

Twenty-seventh Day of August 1985

[SEAL]

Attest:

DONALD J. QUIGG

Attesting Officer     Acting Commissioner of Patents and Trademarks